United States Patent [19]
Sharma

[11] Patent Number: 5,552,633
[45] Date of Patent: Sep. 3, 1996

[54] THREE-DIMENSIONAL MULTIMODULE HDI ARRAYS WITH HEAT SPREADING

[75] Inventor: Shanti S. Sharma, Marlton, N.J.

[73] Assignee: Martin Marietta Corporation, Camden, N.J.

[21] Appl. No.: 469,053

[22] Filed: Jun. 6, 1995

[51] Int. Cl.⁶ .................. H01L 23/02; H01L 23/053; H01L 23/34
[52] U.S. Cl. .................. 257/700; 257/686; 257/727
[58] Field of Search .................. 257/686, 700, 257/727

[56] References Cited

U.S. PATENT DOCUMENTS

| | | | |
|---|---|---|---|
| 4,714,516 | 12/1987 | Eichelberger et al. | 156/628 |
| 4,783,695 | 11/1988 | Eichelberger et al. | 357/65 |
| 4,878,991 | 11/1989 | Eichelberger et al. | 156/630 |
| 4,901,136 | 2/1990 | Neugebauer et al. | 357/75 |
| 4,933,042 | 6/1990 | Eichelberger et al. | 156/239 |
| 4,991,000 | 2/1991 | Bone et al. | 257/686 |
| 5,019,535 | 5/1991 | Wojnarowski et al. | 437/209 |
| 5,073,814 | 12/1991 | Cole, Jr. et al. | 357/54 |
| 5,107,586 | 4/1992 | Eichelberger et al. | 29/830 |
| 5,157,589 | 10/1992 | Cole, Jr. et al. | 257/700 |
| 5,161,093 | 11/1992 | Gorczyca et al. | 361/414 |
| 5,200,810 | 4/1993 | Wojnarowski et al. | 361/398 |
| 5,206,712 | 4/1993 | Kornrumpf et al. | 361/393 |
| 5,229,647 | 7/1993 | Gnadinger | 257/686 |
| 5,241,216 | 8/1993 | Webster | 257/762 |
| 5,270,371 | 12/1993 | Cole et al. | 524/359 |
| 5,285,571 | 2/1994 | Gorczyca et al. | 29/848 |
| 5,331,203 | 7/1994 | Wojnarowski et al. | 257/698 |
| 5,345,205 | 9/1994 | Kornrumpf | 333/246 |
| 5,432,681 | 7/1995 | Linderman | 257/700 |

*Primary Examiner*—Sara W. Crane
*Assistant Examiner*—Valencia Martin Wallace
*Attorney, Agent, or Firm*—W. H. Meise; S. A. Young; G. Chin

[57] ABSTRACT

A three-dimensional array (10) of semiconductor chips (24, 124) includes stacked 2D high density interconnect (HDI) modules (12, 14) held by adhesive (16). Each HDI module has a ceramic substrate (20, 120) with a cavity (22, 122) dimensioned to accommodate a chip. An interconnect sheet (28, 128) has a conductor pattern (30, 130) and vias (32, 132) which interconnect the chips of each HDI module. Thermal conduction from the upper module (12) to the lower module (14) is inhibited by the low thermal conduction of the lower interconnect sheet (128), tending to raise the chip temperature. Thermal conduction is improved by thermally conductive posts (44) extending between upper (20) and lower (120) substrates through apertures (140) in the interconnect sheet (128). If the posts (44) are electrically conductive, they may be used for electrical interconnections among modules of the 3D array.

12 Claims, 2 Drawing Sheets

THREE-DIMENSIONAL MULTIMODULE HDI ARRAYS WITH HEAT SPREADING

STATEMENT OF GOVERNMENT RIGHTS

The Government has rights in this invention under Air Force Contract F30602-94-C0043.

FIELD OF THE INVENTION

This invention relates to three-dimensional semiconductor chip arrays using high-density interconnect (HDI) electronic modules.

BACKGROUND OF THE INVENTION

The continuing need for high-density electronic circuits has given rise to a class of high-density structures termed high-density interconnect (HDI), in which conventional semiconductor chips are fastened in two-dimensional arrays on a substrate, such as a ceramic substrate, with the electrical contact pads of the semiconductor chips facing upward, away from the substrate. Interconnections among the pads of the various semiconductor chips, and power connections, are made by one or more layers of dielectric film, preferably polyimide (KAPTON), which have a pattern of conductors on at least one side thereof, and which make contact with the various contact pads by means of electrically conductive through vias registered with the contact pads, and in electrical communication with the conductor pattern on the dielectric film, as described, for example, in U.S. Pat. No. 4,783,695, issued Nov. 8, 1988 in the name of Eichelberger et al. Later improvements of the structure are described in a large number of patents, among which are U.S. Pat. No. 4,714,516 (Method to Produce Via Holes in Polymer Dielectrics for Multiple Electronic Circuit Chip Packaging); U.S. Pat. No. 4,878,991 (Simplified Method for Repair of High Density Interconnect Circuits); U.S. Pat. No. 4,901,136 (Multi-Chip Interconnection Package); U.S. Pat. No. 4,933,042 (Method for Packaging Integrated Circuit Chips Employing a Polymer Film Overlay Layer); U.S. Pat. No. 5,019,946 (High Density Interconnect With High Volumetric Efficiency); U.S. Pat. No. 5,073,814 (Multi-Sublayer Dielectric Layers); U.S. Pat. No. 5,107,586 (Method for Interconnecting a Stack of Integrated Circuits at a Very High Density); U.S. Pat. No. 5,161,093 (Multiple Lamination High Density Interconnect Process and Structure Employing a Variable Crosslinking Adhesive); U.S. Pat. No. 5,200,810 (High Density Interconnect Structure with Top Mounted Components); U.S. Pat. No. 5,206,712 (Building Block Approach to Microwave Modules); U.S. Pat. No. 5,241,456 (Compact High Density Interconnect Structure); U.S. Pat. No. 5,270,371 (Adhesive Compositions for Electronic Packages); U.S. Pat. No. 5,285,571 (Method for Extending an Electrical Conductor Over the Edge of an HDI Substrate); U.S. Pat. No. 5,331,203 (High Density Interconnect Structure Including a Chamber); and U.S. Pat. No. 5,345,205 (Compact High Density Interconnected Microwave System). These patents relate to two-dimensional arrays of microcircuit chips (including stacks of chips, which are considered to be a single chip for purposes of this invention) on a substrate. When yet higher density is desired, three-dimensional arrays of HDI modules may be considered.

As is known to those skilled in the art, the reliability of a semiconductor chip depends in part upon its operating temperature, because diffusion of the semiconductor dopants can adversely affect performance, and the diffusion is a strong function of temperature. Silicon supplanted germanium as a semiconductor material for active circuits at least in part because it could withstand higher temperatures than germanium without severe adverse effects. Whatever semiconductor material is used in the microcircuit chips, it is imperative that the temperature of the chip be maintained below a particular design maximum temperature at which the reliability or mean time before failure (MTBF) is deemed to be satisfactory. This requirement, in turn, limits the combination of energization power and the thermal resistance between the microcircuit chip and the ultimate heat sink. The energization power will often be specified for a given level of performance, whereupon the thermal resistance is among the only variables available to the package designer. In general, a two-dimensional HDI array will be a relatively flat structure having two principal heat transfer surfaces, and with a relatively low ratio of volume to surface area. In some cases, simple convection will be sufficient to adequately cool the HDI module. If more heat must be carried away, one or more surfaces of the module may be thermally coupled to a heat sink, thereby reducing the thermal resistance between the package as a whole and the ultimate heat sink.

A standard HDI module which might be used for a two-dimensional microcircuit chip array includes a ceramic plate with a plurality of cavities or apertures, each of which is dimensioned to accommodate a particular chip or chip stack. The microcircuit contact pads or terminals face upward out of the cavity, and interconnections between the microcircuits on the module are made by means of a multilayer dielectric film, in which each layer carries a pattern of electrical conductors, and by a plurality of through vias, which are registered with, and interconnect, particular ones of the conductive paths of the pattern with particular contact pads of the chips.

When attempting to generate useful three-dimensional arrays of HDI modules, one of the problems which arises is that of conveying away heat generated by the microcircuit chips during operation. Among the heat transfer problems in stacks of two-dimensional HDI modules such as that described above, in order to form a three-dimensional array of microcircuit chips, is that of the relatively high thermal resistance (low thermal conductivity) of the multilayer dielectric film, which tends to inhibit heat transfer among the layers of HDI modules. Among the solutions which have been analyzed are those in which heat is transferred out through the edges of the module, which may be satisfactory for some situations, but which may not be adequate under all conditions. Improved three-dimensional arrays of microchip modules are desired.

SUMMARY OF THE INVENTION

A multichip circuit module according to the invention includes a two-dimensional microcircuit chip array or HDI module. The first array includes a first semiconductor chip defining length, width and height dimensions, and also including electrical contacts on one side thereof. The first semiconductor chip produces heat during operation. The module also includes a first ceramic substrate defining mutually parallel upper and lower surfaces, and a cavity or aperture in the upper surface having length and width dimensions at least equal to the length and width dimensions of the first semiconductor chip, and having a depth dimension substantially equal to the depth dimension of the first semiconductor chip, but less than the separation between the upper and lower surfaces of the first ceramic substrate. A first chip holding arrangement, such as an adhesive, holds the first semiconductor chip in the cavity in the first ceramic substrate, with the side of the first semiconductor chip having the contacts facing away from the cavity, so that the side of the first semiconductor chip having the contacts is substantially coplanar with the upper surface of the first ceramic substrate. The heat generated by the first semiconductor chip during its operation is conducted, at least in part, to the first ceramic substrate. The first two-dimensional array also includes a first sheet of dielectric film of a material having relatively low thermal conductivity. The first sheet of dielectric film, which may be a polyimide film, overlies the upper surface of the first ceramic substrate and that side of the first semiconductor chip which has the contacts. The first sheet of dielectric film supports a pattern of electrical conductors, and also includes electrically conductive through vias registered with the pattern of electrical conductors and with the contacts of the first semiconductor chip. In the HDI art, the vias extend through individual layers of dielectric, but are staggered in adjacent layers; through vias should be understood in this context. The through vias couple electrical energy, such as signal, or operating power, to the first semiconductor chip during operation. The three-dimensional multichip module array also includes a second two-dimensional microcircuit chip HDI array, which includes a second semiconductor chip defining length, width and height dimensions, and which also includes metal contacts on one side thereof. A second ceramic substrate defines mutually parallel upper and lower surfaces, and also defines a cavity having length and width dimensions at least equal to the length and width dimensions of the second semiconductor chip. The aperture has a depth dimension substantially equal to the depth dimension of the second semiconductor chip. A second chip holding arrangement includes an adhesive for holding the second semiconductor chip in the cavity of the second ceramic substrate, with the side of the second semiconductor chip having the contacts facing away from the cavity of the second ceramic substrate, as a result of which the side of the second semiconductor chip having the contacts is substantially coplanar with the upper surface of the second ceramic substrate. A second sheet of dielectric interconnection film overlies the upper surface of the second ceramic substrate and the side of the second semiconductor chip having the contacts. The second sheet of dielectric film has low thermal conductivity compared with the conductivity of the substrate. The second sheet of dielectric film defines a lower surface adjacent the upper surface of the second ceramic substrate and the side of the second semiconductor chip having the contacts, and an upper surface bearing a pattern of conductors. The second sheet of dielectric film also includes a plurality of electrically conductive through vias extending from the upper surface to the lower surface of the second sheet of dielectric film, the through vias being registered with, and in electrical contact with, contacts of the second semiconductor chip and the pattern of conductors. The second sheet of dielectric film also includes a further plurality of through apertures extending from the upper surface to the lower surface of the second sheet of dielectric film at locations remote from the cavity in the second ceramic substrate. A mechanical coupling arrangement is coupled to the second sheet of dielectric film and to the first ceramic substrate, for mechanically coupling the lower surface of the first ceramic substrate to the upper surface of the second sheet of dielectric film. The mechanical coupling may be a layer of adhesive. As a result of the attachment of the second sheet of dielectric between the bottom of the first substrate and the top of the second substrate, heat generated by the first semiconductor chip tends to be blocked from flowing toward the second substrate, undesirably tending to raise the temperature of the first semiconductor chip by reducing thermal conduction from the first semiconductor chip to the second ceramic substrate. A thermally conductive arrangement fills the further plurality of through apertures in the second dielectric sheet, for providing low-thermal-resistance paths for the flow of heat from the first semiconductor chip through the bottom surface of the first ceramic substrate, through the thermally conductive arrangement filling the further plurality of apertures in the second dielectric sheet, to the second ceramic substrate. The thermally conductive arrangement, in one embodiment of the invention, includes a thermally conductive filler which is placed in the aperture, and which makes thermal contact with the first and second substrates, and which therefore acts as a thermal bypass to the dielectric film. In another embodiment of the invention, the thermally conductive filler is a metal column or slug which is sputtered into the aperture, and the metal is electrically conductive. Instead of sputtering, plating or other deposition may be used. The metal slug is also used to aid in making electrical contact between the pattern of electrical conductors on the layers of dielectric film. In a particularly advantageous double use of the metal slug, it is connected to one of the terminals of the power source, and to a power conductor of the pattern of conductors, or to a ground conductor. In another embodiment, the ceramic substrate includes a more thermally conductive post, such as a metal post, extending between its upper and lower surfaces, and in registry with the thermal bypass post or slug extending through the dielectric layer. Electrically conductive or nonconductive adhesives are used, as appropriate, at various locations at the interface between the two-dimensional arrays which form the three-dimensional array, to provide electrical conduction at the appropriate locations.

DESCRIPTION OF THE INVENTION

Figure 1:
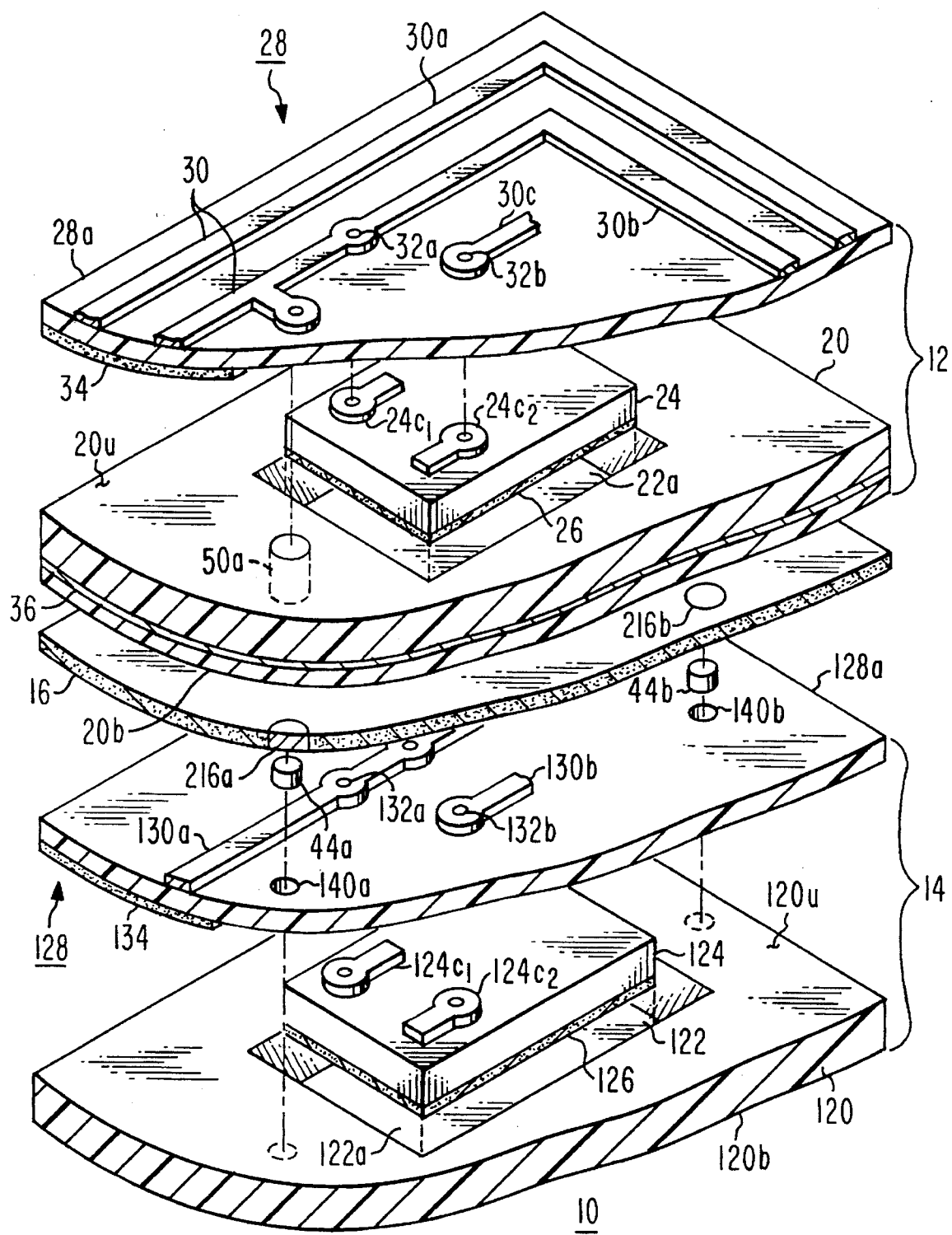
FIG. 1 is a simplified, exploded view of a portion of a two-layer, three-dimensional array of microcircuits in accordance with the invention.
Figure 2:
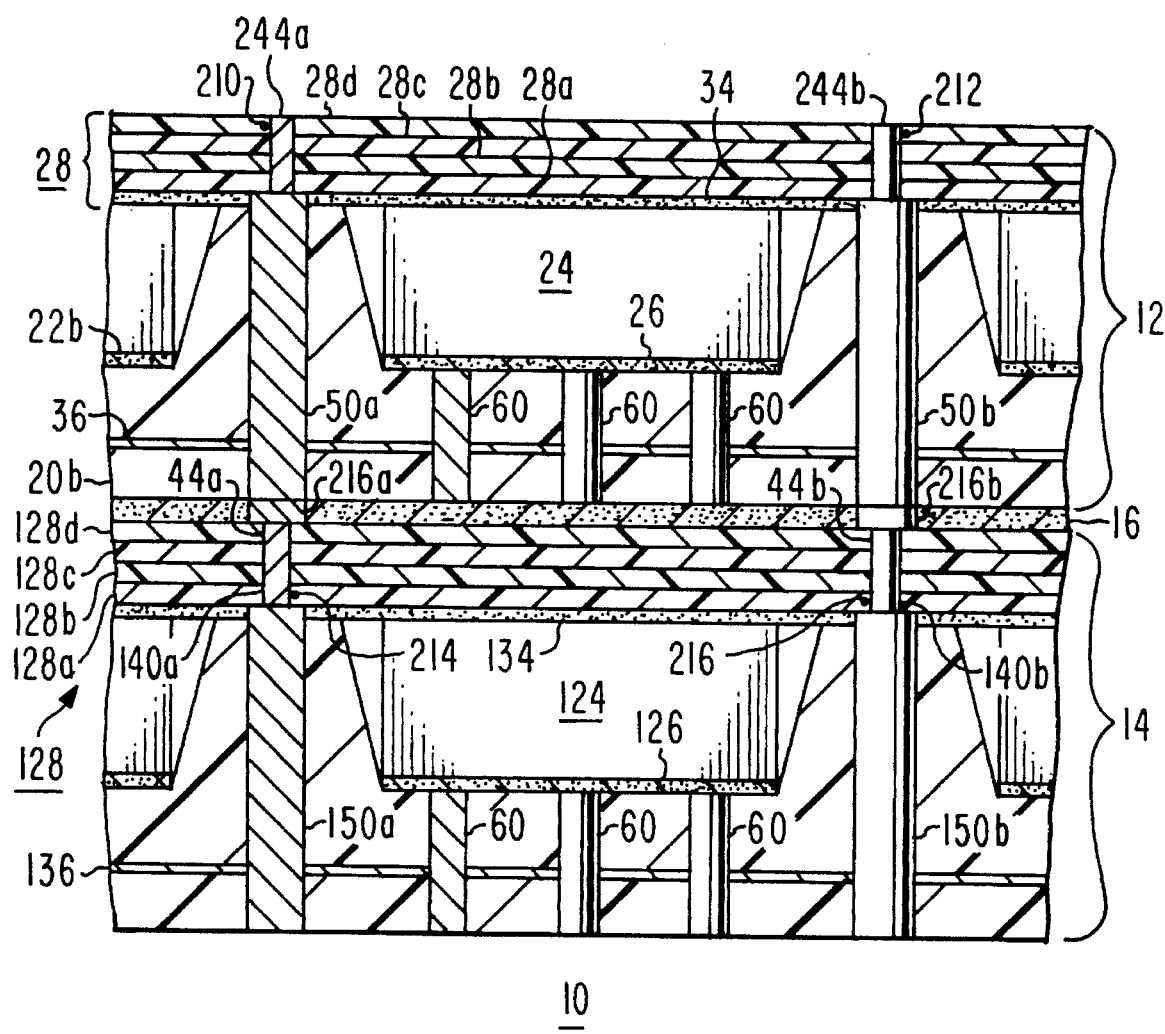
FIG. 2 is a cross-sectional view of the structure of FIG. 1.

In FIGS. 1 and 2, a multilayer, three-dimensional semiconductor chip structure designated generally as 10 includes a first or upper HDI module 12 and a second, lower HDI module 14, held together by a layer of adhesive 16. Each HDI module 12 and 14 is generally conventional, except as described below.

Upper HDI module 12 includes a ceramic substrate 20 with an upper surface 20u parallel to a bottom surface 20b. Substrate 20 includes a plurality of flat-bottomed cavities or apertures, one of which is designated 22a, and others of which, designated 22b and 22c, are visible in FIG. 2. While the cavities 22a, b and c are illustrated as having slanted sides, this is merely to aid in illustrating the arrangement. Each aperture 22a, 22b, 22c, . . . has a depth which is selected to accommodate the semiconductor chip (or chip stack) which is placed therein. A semiconductor chip 24 is illustrated as being set within cavity 22a, and held in place by a thin layer of adhesive 26, which is preferably a thermally conductive adhesive. The depth of cavity 22a, and the corresponding thickness of semiconductor chip 24, is less than the spacing between upper surface 20u and lower surface 20b of substrate 20. When the depth of cavity 22a and the thickness of chip 24 are substantially the same, the upper surface of chip 24 is roughly coplanar with the upper surface 20u of the substrate, which facilitates the HDI interconnections.

Each semiconductor chip of HDI module 10 includes a pattern of electrical contacts, which are generally metallic contact pads or terminals. Two contact pads of chip 24, and a portion of a conductor trace associated with each, are illustrated as $24c_1$ and $24c_2$ in FIG. 1. These pads may be, for example, signal or electrical energization connections. HDI interconnections in the arrangement of FIGS. 1 and 2 are accomplished by interconnecting the contact pads of the various semiconductor chips of the module, by means of an interconnection sheet or stack 28 of one or more layers of conductor-pattern carrying dielectric layers. In principle, only one dielectric layer is sufficient to make some interconnections, but when many chips are to be interconnected in a complex manner, multiple layers are convenient. FIG. 1 illustrates only dielectric layer 28a of interconnection sheet 28 of module 10, while FIG. 2 illustrates a multilayer stack 28 of dielectric layers 28a, 28b, 28c, and 28d. Each layer of dielectric film carries a pattern of electrically conductive leads on a surface, illustrated as pattern 30 on the upper surface in FIG. 1. Pattern 30 includes conductors 30a 30b, and 30c. The conductors of each dielectric layer 28a, 28b, 28c, . . . make contact, as required, with the conductors of the adjacent dielectric layers, by electrically conductive through vias extending between conductors of different layers, all as known in the art. In FIG. 1, conductive through vias registered with contact pads $24c_1$ and $24c_2$ are illustrated as 32a and 32b, respectively. Dielectric layer 28a is adhesively coupled, if necessary, to the upper surface of semiconductor chip 24 and the upper surface 20u of ceramic substrate 20, by a layer 34 of adhesive. In some situations, the ceramic substrate 20 may include a layer of electrically conductive material, such as metal layer 36, extending parallel to lower surface 20b, between the bottom of the deepest cavity, such as aperture 22a, and the bottom surface 20b of the substrate.

Three-dimensional array 10 of semiconductor chips of FIGS. 1 and 2 also includes a second two-dimensional HDI array 14 of semiconductor chips. In general, array 14 is similar to array 12, and corresponding elements are designated by the same reference numerals in the 100 series. In FIGS. 1 and 2, bottom HDI module 14 includes a ceramic substrate 120 with an upper surface 120u parallel to a bottom surface 120b. Substrate 120 includes a plurality of flat-bottomed cavities or apertures, one of which is designated 122a. Cavity 122 has a depth which is selected to accommodate the semiconductor chip (or chip stack) which is placed therein. A semiconductor chip 124 is illustrated as being set within aperture 122, and held in place by a thin layer of adhesive 126, which is preferably a thermally conductive adhesive. The depth of cavity 122, and the corresponding thickness of semiconductor chip 124, is less than the spacing between upper surface 120u and lower surface 120b of substrate 120. When the depth of cavity 122 and the thickness of chip 124 are substantially the same, the upper surface of chip 124 is roughly coplanar with the upper surface 120u of the substrate, which facilitates the HDI interconnections.

Two contact pads of chip 124, and a portion of a conductor trace associated with each, are illustrated as $124c_1$ and $124c_2$ in FIG. 1. These pads may be, for example, signal or electrical energization connections. HDI interconnections in the arrangement of FIGS. 1 and 2 are accomplished by interconnecting the contact pads of the various semiconductor chips of the module, by means of an interconnection sheet 128 of one or more stacked layers of conductor-pattern carrying dielectric layers. In principle, only one dielectric layer is sufficient to make some interconnections, but when many chips are to be interconnected, multiple layers are convenient. FIG. 1 illustrates only dielectric layer 128a of interconnection stack 128 of module 10, while FIG. 2 illustrates a multilayer stack 128 of dielectric layers 128a, 128b, 128c, and 128d. Each layer of dielectric film carries a pattern of electrically conductive leads on a surface, illustrated as the upper surface in FIG. 1, which carries a pattern 130 including conductors 130a and 130b. The conductors of each layer 28a, 28b, 28c, . . . make contact, as required, with the conductors of the adjacent dielectric layers, by electrically conductive through vias extending between conductors of different layers, all as known in the art. In FIG. 1, conductive through vias registered with contact pads $124c_1$ and $124c_2$ are illustrated as 132a and 132b, respectively. Dielectric layer 128a is adhesively coupled, if necessary, to the upper surface of semiconductor chip 124 and the upper surface 120u of ceramic substrate by a layer 134 of adhesive.

A layer of adhesive designated 16 connects the bottom surface 20b of upper two-dimensional HDI array 12 to the outermost surface of interconnection dielectric stack 128 of lower two-dimensional HDI array 14, to generate a high-density three-dimensional arrangement. As mentioned above, this gives rise to a thermal problem. HDI module 12, by itself, can radiate from the upper surface 20u and bottom surface 20b, but the thermal resistance through upper surface 20u is greater than through bottom surface 20b, because of the presence of interconnection dielectric stack 28. Thus, the heat generated by the semiconductor chips of upper HDI module 12 preferentially exits through bottom surface 20b, especially if the bottom surface is affixed to a heat sink. When the bottom surface 20b of upper HDI module 12 is affixed to the outermost dielectric layer (128d in FIG. 2, 28a in FIG. 1) of the lower HDI module, upper HDI module 12 has a low-thermal-conductivity layer adjacent both its upper and lower sides, which tends to block heat flow toward both its major surfaces. Consequently, the temperature of the semiconductor chips of upper HDI module 12 tends to rise, which is undesirable from a reliability standpoint. When more than two HDI modules are stacked, as for example three HDI modules, the module in the middle may have multiple layers of low-thermal-conductivity dielectric interconnection stacked between the heat-generating semiconductor chips and the ultimate heat sink.

According to an aspect of the invention, thermal conductivity is maintained through the sheet of stacked of interconnection dielectric films 28, 128, . . . by thermally conductive columns or elements, which essentially provide paths by which the heat can move through particular parts of the dielectric stacks. Referring to FIGS. 1 and 2, the single-dielectric-layer dielectric interconnection sheet 128 of FIG. 1, and the multiple-dielectric-layer stack interconnection sheet 128 of FIG. 2 both have a plurality of apertures extending therethrough, two of which are designated 140a and 140b. These apertures are filled with columns or slugs 244a and 244b, respectively, of thermally conductive material. In one embodiment of the invention, the apertures 140a and 140b are made with the use of lasers after the HDI module is assembled, and the locations which are selected for making the holes are locations which, as illustrated in FIGS. 1 and 2, do not overlie the semiconductor chips 124 or the edges of cavities 122, but which instead overlie those portions of upper surface 120u of the ceramic substrate 120 of lower HDI module 14, and which also do not contact any of the conductive paths of the conductor pattern 130a, 130b. . . of FIG. 1. Columns 44a and 44b of thermally conductive material, such as copper, are located within the apertures 140a and 140b, respectively, with their lower surfaces in contact with the upper surface 120u of the ceramic substrate. In this fashion, the copper columns are in contact with the ceramic substrate 120, so that good thermal conductivity is provided between the ceramic and the columns. The copper columns have a length or height which is equal to the thickness of the multilayer dielectric sheet through which they pass. Such a structure may be readily fabricated by sputtering or depositing the copper into the apertures 140a, 140b, to fill the apertures. The upper ends of the columns are very near to the bottom surface 20b of the ceramic substrate 20 of the overlying HDI module 12, separated therefrom only by the thickness of adhesive layer 16. As mentioned, adhesive layer 16 may be thermally conductive, whereby good thermal conduction is achieved between the ceramic modules of the upper and lower HDI modules, through the interconnection dielectric layer 128. A large number of small-diameter columns 44a, 44b, . . . are preferable to a few larger columns, because the presence of a column prevents the routing of conductors of the conductor patterns of the interconnection dielectric sheet 128 through that particular location. Remembering that the column extends through all the layers of the interconnection dielectric sheet, a large column will make a corresponding area of each sheet useless for interconnection conductors, while a plurality of small columns of like area (and therefore like thermal conduction) allows interconnection conductors to be routed between the columns in at least some of the layers. In different embodiments of the invention, the columns have diameters of about 5, 10, and 15 mils. Thus, multiple two-dimensional HDI modules can be stacked into three-dimensional arrays, while maintaining good heat conduction between adjacent modules, and allowing the inner modules to be adequately heat-sunk.

While metal columns are convenient for use in bridging the interconnection dielectric sheet as described above, the columns could be of any other material having a relatively high thermal conductivity, such as ceramic.

According to another aspect of the invention, the thermally conductive columns, such as columns 44a and 44b of FIGS. 1 and 2, are also electrically conductive, and are used to aid in making electrical connections, especially power connections, among the modules. Referring to FIG. 2, each ceramic substrate 20, 120, includes a plurality of high-thermal-conductivity slugs 60 extending from the lower surface of the semiconductor chip cavity to the lower surface 20b, 120b of the ceramic substrate, to reduce the thermal resistance between the semiconductor chips and the bottom surface of the ceramic substrate. Slugs 60 may be of a metal such as copper or silver. Similarly, the thermal conductivity between the upper surfaces 20u, 120u and the lower surfaces 20b, 120b, of the substrates is improved by metal slugs 50a, 50b in upper substrate 20, and 150a, 150b in lower substrate 120. The locations of columns 44a and 44b are registered with slugs 150a and 150b, respectively, so that an electrically continuous path is formed. A further column 244a and 244b is formed in the interconnection dielectric sheet 28 of upper module 12, registered with slugs 50a and 50b, respectively. Since the ceramic substrates are identical, the slugs and the columns make a continuous electrical path along their length, except for the location of adhesive layer 16. The electrical connections at these locations are made by use of an electrically conductive adhesive pad 216a and 216b at the locations of columns 44a and 44b, respectively, which provide an electrically continuous path through the slugs and columns, together with electrically nonconductive adhesive 16 in the remainder. An electrical connection made between interconnection layer 28d of FIG. 2 and column 244a, as at connection point 210, can couple electrical energy in the form of signal or power through column 244a, Slug 50a, and column 44a. A connection from column 44a to interconnection layer 128a, as suggested by connection point 214, allows connection from one terminal of a power supply (not illustrated) connected to connection layer 28d, for example, through a relatively low-ohmic-resistance path to layer 128a, which could couple the power to semiconductor chip 124. Similarly, another terminal of the power supply could be coupled to upper interconnection layer 28c, for example, and by way of connection point 212, through column 244b, slug 50b, and conductive adhesive layer 216b, and column 44b to a connection point 216. One or the other of these terminal might be a ground terminal, in which case metal layer 36 may be coupled thereto, to provide a measure of electrostatic shielding between the upper and lower two-dimensional HDI modules 12 and 14. Additional thermally conductive slugs 150a and 150b are used to aid in carrying heat to bottom surface 120b of the lower HDI module 14, and if slugs 150a and 150b are also electrically conductive, to carry electrical energy to additional two-dimensional HDI modules (not illustrated) placed below HDI module 84.

Thus, a three-dimensional multichip circuit module (10) according to the invention includes a first semiconductor chip (24) defining length, width and height dimensions, and also includes metallic contacts ($24c_1$ and $24c_2$) on one side thereof. The first semiconductor chip produces heat during operation. A first ceramic substrate (20) defines mutually parallel upper (20u) and lower (20b) surfaces, and an aperture (22a) in the upper surface has length and width dimensions at least equal to the length and width dimensions of the first semiconductor chip (24), and has a depth dimension substantially equal to said depth dimension of the first semiconductor chip (24), but less than the separation between the upper (20u) and lower (20b) surfaces of the first ceramic substrate (20). A first chip holder (adhesive 26) holds the first semiconductor chip (24) in aperture (26) in the first ceramic substrate (20), with that side of the first semiconductor chip (24) having its contacts facing away from the aperture, whereby that side of the first semiconductor chip having contacts is substantially coplanar with the upper surface (20u) of the first ceramic substrate (20), and the heat generated by the first semiconductor chip during operation is conducted, at least in part, to the first ceramic substrate (20). A first sheet (28) of dielectric interconnection film of a material having relatively low thermal conductivity overlies the upper surface (20u) of the first ceramic substrate (20) and that side of the first semiconductor chip (24) having the contacts ($24c_1$, $24_2$). The first sheet of interconnection dielectric film supports a pattern of electrical conductors (30), and also includes electrically conductive through vias (32a, 32b) registered with the pattern of electrical conductors (30) and with the contacts ($24c_1$, $24_2$) of the first semiconductor chip (24), for coupling electrical energy to the first semiconductor chip (24) during operation. The three-dimensional array (10) includes a second semiconductor chip (124) defining length, width and height dimensions, and also includes electrical or metal contacts ($124c_1$, $124c_2$) on one side thereof. A second ceramic substrate defines mutually parallel upper (120u) and lower (120b) surfaces, and also defines an aperture (122) having length and width dimensions at least equal to the length and width dimensions of the second semiconductor chip (124), and having a depth dimension substantially equal to the depth dimension of the second semiconductor chip (124). A second chip holder (adhesive 126) holds the second semiconductor chip (124) in the aperture (122) of the second ceramic substrate (120), with that side of the second semiconductor chip (124), which has the contacts, facing away from the aperture (122) in the second ceramic substrate (120), as a result of which that side of the second semiconductor chip (124) having contacts is substantially coplanar with the upper surface (120u) of the second ceramic substrate (120). A second sheet of interconnection dielectric film (128) of a material having a relatively low thermal conductivity overlies the upper surface (120u) of the second ceramic substrate (120) and that side of the second semiconductor chip (124) having the contacts. The second sheet of dielectric film (128) defines a lower surface which is adjacent to the upper surface of the second ceramic substrate (120) and to that side of the second semiconductor chip (124) having the contacts. The second sheet of dielectric film (128) has an upper surface bearing a pattern of conductors (130). The second sheet of dielectric film (128) also includes a plurality of electrically conductive through vias (132a, 132b) extending from the upper surface to the lower surface of the second sheet of dielectric film (128). The through vias are registered with, and in electrical contact with at least some of the contacts of the second semiconductor chip (124). The second sheet of dielectric film (128) also includes a further plurality of through apertures (140a, 140b) extending from the upper surface to the lower surface of the second sheet of dielectric film (128) at locations remote from, or removed from, the aperture (140a, 140b) in the second ceramic substrate (120). A mechanical coupling arrangement (adhesive 16) is coupled to the second sheet of dielectric film (128) and to the first ceramic substrate (20), for mechanically coupling the lower surface (20b) of the first ceramic substrate (20) to the upper surface of the second sheet of dielectric film (128), whereby heat generated by the first semiconductor chip (24) tends to be blocked by the second dielectric sheet (128), undesirably tending to raise the temperature of the first semiconductor chip (24) by reducing thermal conduction from the first semiconductor chip (24) to the second ceramic substrate (120). A thermally conductive element (44a, 44b) extends through or fills the further plurality of through apertures (140a, 140b) in the second dielectric sheet (128), for providing low-thermal-resistance paths for the flow of heat from the first semiconductor chip (24) through the bottom surface (20b) of the first ceramic substrate (20), through the thermally conductive element (44a, 44b) extending through the further plurality of apertures (140a, 140b) in the second dielectric sheet (128), to the second ceramic substrate (120).

Other embodiments of the invention will be apparent to those skilled in the art. For example, while four layers of dielectric interconnection film have been illustrated, more or fewer layers may be used, as appropriate. Each layer of interconnection dielectric film may have an electrical conductor pattern on the upper surface, lower surface, or both. While a stack of two HDI modules has been illustrated, and a stack of three modules mentioned, any number of HDI modules may be stacked to form a three-dimensional array of semiconductor chips; the thermal bypass slugs or columns may be used between all the layers, or only with some layers of the 3D array. While the thermally conductive columns or slugs are illustrated as having a circular cross-section, any cross-section may be used. While interconnection of a column 44 or 244 to the metal pattern of a single dielectric layer of each interconnection sheet has been illustrated, the conductive column may be connected to the conductor pattern of any layer of any sheet, or to multiple layers, as may be desired.

What is claimed is:

1. A multichip circuit module, comprising:

a first semiconductor chip defining length, width and height dimensions, and including metallic contacts on one side thereof, said first semiconductor chip producing heat during operation thereof;

a first ceramic substrate defining mutually parallel upper and lower surfaces, and an aperture in said upper surface having length and width dimensions at least equal to said length and width dimensions of said first semiconductor chip, and having a depth dimension substantially equal to said depth dimension of said first semiconductor chip, but less than the separation between said upper and lower surfaces of said first ceramic substrate;

first chip holding means for holding said first semiconductor chip in said aperture in said first ceramic substrate, with said side of said first semiconductor chip having said contacts facing away from said aperture, whereby said side of said first semiconductor chip having said contacts is substantially coplanar with said upper surface of said first ceramic substrate, and said heat generated by said first semiconductor chip during operation is conducted, at least in part, to said first ceramic substrate;

a first sheet of dielectric film of a material having relatively low thermal conductivity, said first sheet of dielectric film overlying said upper surface of said first ceramic substrate and said side of said first semiconductor chip having said contacts, said first sheet of dielectric film supporting a pattern of electrical conductors, and also including electrically conductive through vias registered with said pattern of electrical conductors and with said contacts of said first semiconductor chip, for coupling electrical energy to said first semiconductor chip during operation;

a second semiconductor chip defining length, width and height dimensions, and also including metal contacts on one side thereof;

a second ceramic substrate defining mutually parallel upper and lower surfaces, and also defining an aperture having length and width dimensions at least equal to said length and width dimensions of said second semiconductor chip, and having a depth dimension substantially equal to said depth dimension of said second semiconductor chip;

second chip holding means for holding said second semiconductor chip in said aperture of said second ceramic substrate, with said side of said second semiconductor chip having said contacts facing away from said aperture of said second ceramic substrate, whereby said side of said second semiconductor chip having said contacts is substantially coplanar with said upper surface of said second ceramic substrate;

a second sheet of dielectric film of a material having a relatively low thermal conductivity, said second sheet of dielectric film overlying said upper surface of said second ceramic substrate and said side of said second semiconductor chip having said contacts, said second sheet of dielectric film defining a lower surface adjacent said upper surface of said second ceramic substrate and said side of said second semiconductor chip having said contacts, and an upper surface bearing a pattern of conductors, said second sheet of dielectric film also including a plurality of electrically conductive through vias extending from said upper surface to said lower surface of said second sheet of dielectric film, said through vias being registered with, and in electrical contact with, said contacts of said second semiconductor chip, said second sheet of dielectric film also including a further plurality of through apertures extending from said upper surface to said lower surface of said second sheet of dielectric film at locations remote from said aperture in said second ceramic substrate;

mechanical coupling means coupled to said second sheet of dielectric film and to said first ceramic substrate, for mechanically coupling said lower surface of said first ceramic substrate to said upper surface of said second sheet of dielectric film, whereby heat generated by said first semiconductor chip tends to be blocked by said second dielectric sheet, undesirably tending to raise the temperature of said first semiconductor chip by reducing thermal conduction from said first semiconductor chip to said second ceramic substrate;

thermally conductive means filling said further plurality of through apertures in said second dielectric sheet, for providing low-thermal-resistance paths for the flow of heat from said first semiconductor chip through said bottom surface of said first ceramic substrate, through said thermally conductive means filling said further plurality of apertures in said second dielectric sheet, to said second ceramic substrate.

2. A module according to claim 1, further comprising:

a thermal conductor extending from said upper to said lower surface of said second ceramic substrate at a location registered with one of said thermally conductive means filling said further plurality of through apertures in said second dielectric sheet.

3. A module according to claim 2, wherein said thermal conductor, extending from said upper to said lower surface of said second ceramic substrate at a location registered with one of said thermally conductive means filling said further plurality of apertures in said second dielectric sheet, is electrically conductive, and is in electrical contact with said one of said thermally conductive means filling said further plurality of apertures in said second dielectric sheet; and said one of said thermally conductive means filling said further plurality of apertures in said second dielectric sheet is in electrical contact with an electrical conductor of said pattern of electrical conductors, whereby said thermal conductor extending from said upper to said lower surface of said second ceramic substrate is also in electrical contact with said electrical conductor of said pattern of electrical conductors.

4. A module according to claim 1, wherein said thermally conductive means filling said further plurality of through apertures comprises metal.

5. A module according to claim 3, wherein said one of said thermally conductive means filling said further plurality of apertures in said second dielectric sheet is in electrical contact with a terminal of a source of electrical energization power.

6. A module according to claim 4, wherein said metal is copper.

7. A module according to claim 1, wherein said mechanical coupling means comprises adhesive means.

8. A module according to claim 7, wherein said adhesive comprises at least a portion which is electrically conductive.

9. A module according to claim 1, wherein said mechanical coupling means comprises a further layer of dielectric film of said material having a relatively lower thermal conductivity.

10. A module according to claim 9, wherein said dielectric film material is polyimide.

11. A module according to claim 1, wherein said material of said second sheet of dielectric material is polyimide.

12. A module according to claim 1, wherein:

said first sheet of dielectric film is of a material having relatively low thermal conductivity, said first sheet of dielectric film supporting a pattern of conductors; and at least one of said thermally conductive means filling said further plurality of through apertures in said second dielectric sheet is electrically conductive, and makes electrical contact with a conductor of said pattern of conductors of said second dielectric sheet.

\* \* \* \* \*